(12) United States Patent
Wolschrijn et al.

(10) Patent No.: US 8,553,200 B2
(45) Date of Patent: Oct. 8, 2013

(54) OPTICAL ELEMENT WITH AT LEAST ONE ELECTRICALLY CONDUCTIVE REGION, AND ILLUMINATION SYSTEM WITH THE OPTICAL ELEMENT

(75) Inventors: Bastiaan Theodoor Wolschrijn, Aboude (NL); Dirk Heinrich Ehm, Lauchheim (DE); Berndt Warm, Schwaig (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 833 days.

(21) Appl. No.: 12/751,849

(22) Filed: Mar. 31, 2010

(65) Prior Publication Data

US 2010/0231877 A1    Sep. 16, 2010

Related U.S. Application Data

(63) Continuation of application No. PCT/EP2008/008350, filed on Oct. 2, 2008.

(30) Foreign Application Priority Data

Oct. 4, 2007   (DE) .................... 10 2007 047 446

(51) Int. Cl.
*G03B 27/42*    (2006.01)

(52) U.S. Cl.
USPC .................... 355/53; 355/63; 355/67; 355/77

(58) Field of Classification Search
USPC .......................... 355/53, 63, 67, 77
See application file for complete search history.

(56) References Cited

U.S. PATENT DOCUMENTS

| | | | |
|---|---|---|---|
| 4,490,041 A | 12/1984 | Riemer | |
| 6,198,793 B1 | 3/2001 | Schultz et al. | |
| 6,324,255 B1 | 11/2001 | Kondo et al. | |
| 6,353,470 B1 | 3/2002 | Dinger | |
| 6,438,199 B1 | 8/2002 | Schultz et al. | |
| 6,842,500 B1 | 1/2005 | Komatsuda et al. | |

(Continued)

FOREIGN PATENT DOCUMENTS

| | | |
|---|---|---|
| EP | 0 421 746 | 4/1991 |
| EP | 1 901 125 | 3/2008 |

(Continued)

OTHER PUBLICATIONS

Japanese Office Action, with English translation, corresponding to JP Appl No. 2010-527361, dated Aug. 31, 2012.

(Continued)

*Primary Examiner* — Steven H Whitesell Gordon
*Assistant Examiner* — Mesfin T Asfaw
(74) *Attorney, Agent, or Firm* — Fish & Richardson P.C.

(57) ABSTRACT

An optical element includes first regions which reflect or transmit the light falling on the optical element. The optical element also includes second regions which are in each instance separated by a distance from a first region and which at least partially surround a first region. The second regions are designed to be at least in part electrically conductive and are electrically insulated from the first regions. The optical element includes a carrier element and at least two first regions in the form of mirror facets which are arranged on the carrier element. The second regions are arranged with a separation from the mirror facets on the carrier element and are electrically insulated against the carrier element as well as against the mirror facet. At least one mirror facet is surrounded by an electrically conductive second region.

40 Claims, 7 Drawing Sheets

(56) References Cited

U.S. PATENT DOCUMENTS

| | | |
|---|---|---|
| 2002/0186811 A1 | 12/2002 | Weiss et al. |
| 2003/0002023 A1 | 1/2003 | Bunau et al. |
| 2005/0174650 A1 | 8/2005 | Melzer et al. |
| 2005/0274897 A1 | 12/2005 | Singer et al. |
| 2006/0103908 A1 | 5/2006 | Loopstra et al. |
| 2006/0132747 A1 | 6/2006 | Singer et al. |
| 2006/0175556 A1 | 8/2006 | Yabuki |

FOREIGN PATENT DOCUMENTS

| | | |
|---|---|---|
| JP | 05-011099 | 1/1993 |
| JP | 2000-056099 A2 | 2/2000 |
| JP | 2003-031490 A2 | 1/2003 |
| JP | 2005-524236 A | 8/2005 |
| JP | 2005-345102 A | 12/2005 |
| JP | 2006-010740 A | 1/2006 |
| JP | 2006-501660 A | 1/2006 |
| JP | 2006140504 A2 | 6/2006 |
| JP | 2006-216917 A | 8/2006 |
| WO | WO 02/27401 | 4/2002 |
| WO | WO 02/065482 | 8/2002 |
| WO | WO 2004/031854 | 4/2004 |
| WO | WO 2005/006081 A1 | 1/2005 |
| WO | WO 2006/085626 A1 | 8/2006 |

OTHER PUBLICATIONS

W. Ulrich et al., "Trends in Optical Design of Projection Lenses for UV- and EUV-Lithography", in Soft X-Ray and EUV Imaging Systems, W. M. Kaiser, R. H. Stulen (editors), Proceedings of SPIE, vol. 4146 (2000), pp. 13-24.

M. Antoni et al., "Illumination Optics Design for EUV-Lithography", in Soft X-Ray and EUV Imaging Systems, W. M. Kaiser, R. H. Stulen (editors), Proceedings of SPIE, vol. 4146 (2000), pp. 25-34.

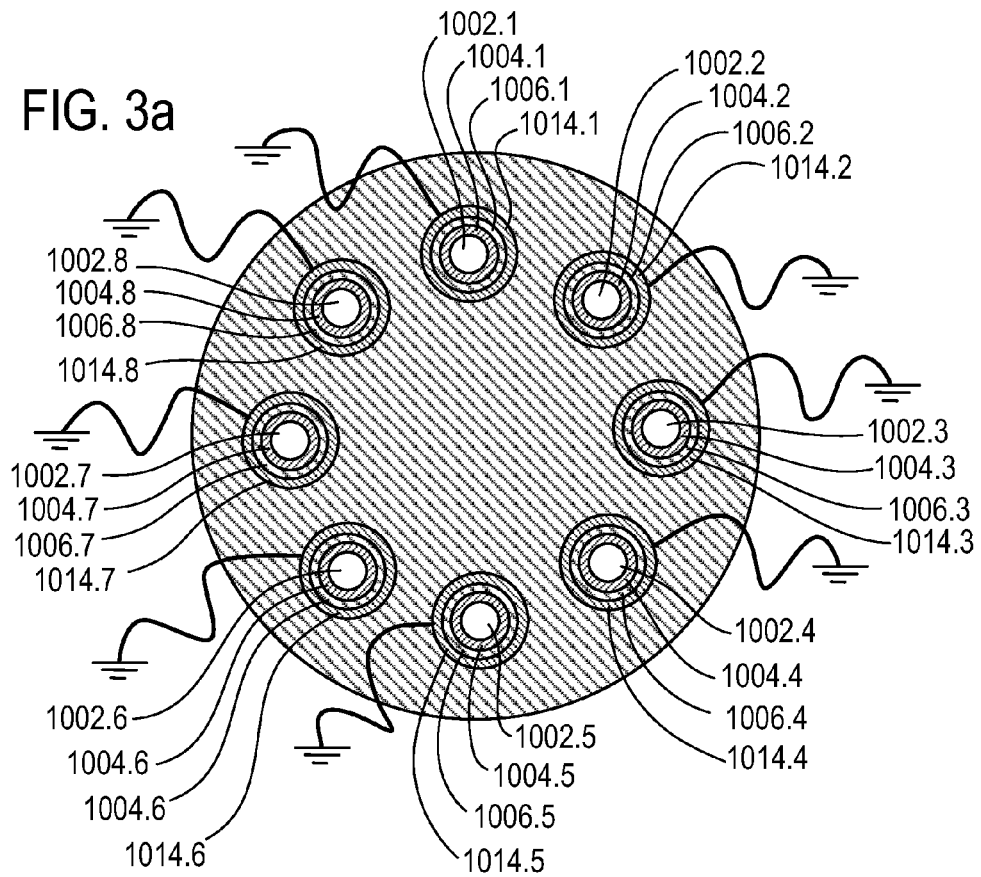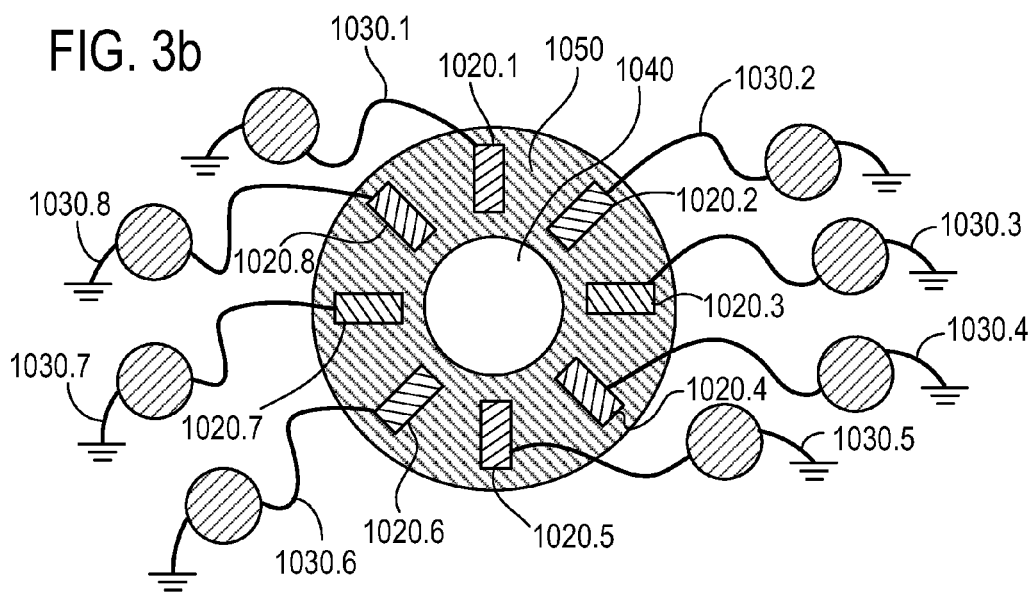

OPTICAL ELEMENT WITH AT LEAST ONE ELECTRICALLY CONDUCTIVE REGION, AND ILLUMINATION SYSTEM WITH THE OPTICAL ELEMENT

CROSS-REFERENCE TO RELATED APPLICATIONS

This application is a continuation of, and claims benefit under 35 USC 120 to, international application PCT/EP2008/008350, filed Oct. 2, 2008, which claims benefit of German Application No. 10 2007 047 446.8, filed Oct. 4, 2007. International application PCT/EP2008/008350 is hereby incorporated by reference in its entirety.

FIELD

The disclosure relates to an optical element with at least one electrically conductive region and also to an illumination system with such an element.

BACKGROUND

To allow a further reduction in the widths of structures of electronic components, particularly into the sub-micron range, it is desirable to use shorter wavelengths for the light that is used in the microlithography process. It is conceivable to use light with wavelengths shorter than 100 nm, for example in a lithographic process with soft X-rays, which is referred to as EUV lithography.

The field of EUV lithography is one of the most promising lithographic techniques of the future. Currently under discussion are wavelengths for EUV lithography in the range of 5 nm to 30 nm, especially 11 to 14 nm, in particular 7 nm or 13.5 nm, with a numerical aperture of 0.2 to 0.3. The image quality in the EUV lithography process is determined on the one hand by the projection objective and on the other hand by the illumination system. The illumination system desirably provides the most uniform illumination possible for the field plane in which the structure-carrying mask, the so-called reticle, is arranged.

The projection objective projects an image of the field plane into an image plane, the so-called wafer plane, in which a light-sensitive object is arranged. Projection exposure apparatus for EUV lithography are designed with reflective optical elements. The field in the image plane of an EUV projection exposure apparatus typically has the shape of a ring field with a high aspect ratio, with a width of 2 mm and an arc length of 22 to 26 mm. The projection systems are normally operated in the scanning mode. Concerning the subject of EUV projection exposure apparatus, reference is made to the following publications: W. Ulrich, S. Beiersdörfer, H. J. Mann, "Trends in Optical Design of Projection Lenses for UV- and EUV-Lithography", in Soft X-Ray and EUV Imaging Systems, W. M. Kaiser, R. H. Stulen (editors), Proceedings of SPIE, Vol. 4146 (2000), pp. 13-24; and M. Antoni, W. Singer, J. Schultz, J. Wangler, I. Escudero-Sanz, B. Kruizinga, "Illumination Optics Design for EUV-Lithography", in Soft X-Ray and EUV Imaging Systems, W. M. Kaiser, R. H. Stulen (editors), Proceedings of SPIE, Vol. 4146 (2000), pp. 25-34. The entire contents of both of these publications are incorporated by reference herein.

In order to project an image of a mask that is arranged in an image plane of the illumination system onto a light-sensitive substrate, for example a wafer, which can be used for the production of semiconductor elements, it is desirable for the shape of the illumination and the illumination intensity in the plane in which the mask is arranged to be kept constant during the exposure process. A change of the illumination can be caused by a change in power or a change in position as a result of, respectively, a degradation of the light source or a change in the position of the light source.

Particularly in illumination systems having two partial systems, i.e. a first partial system including at least the light source and possibly a collector, and a second partial system including at least one optical element with mirror facets, a change in the radiation characteristics of the light source, a change in the position of the source, or also a centering error or adjustment error, i.e. a misalignment of the first and the second partial system, can cause fluctuations of the illumination of the field in a field plane and/or of the exit pupil in an exit pupil plane of an illumination system, or a loss of uniformity in the field plane and/or a telecentricity error in the exit pupil.

The adjustment error described above between a first partial system including a light source unit and a second partial system including optical components serving for example to illuminate a field plane or a pupil plane represents only one possible out-of-adjustment condition in an optical system, specifically an optical system which finds application for example in microlithography. Another possible adjustment error could for example consist of an out-of-adjustment condition of individual optical components, for example individual mirrors in a projection objective.

A projection exposure apparatus which is described in U.S. Pat. No. 6,842,500 includes a device whereby the strength of the illumination, the so-called exposure dose, can be determined. Also disclosed in U.S. Pat. No. 6,842,500 is an illumination system which has a first partial system including a light source and a collector, wherein the first partial system projects an image of the light source into an intermediate image. The illumination system further includes a second partial system which in the light path from the light source to the exit pupil is arranged downstream of the intermediate image of the light source, wherein the second partial system includes optical components serving to illuminate a field in a field plane and an exit pupil in an exit pupil plane. As is further described in general terms in U.S. Pat. No. 6,842,500, as a way of aligning a first and a second partial system, the illumination device includes a detection device which serves to detect deviations of the positions of the optical axes between the first partial system, the so-called source system, and the second partial system. To implement this concept, U.S. Pat. No. 6,842,500 proposes in general terms to place sensors on a facet mirror that is arranged in the second partial system. To provide the capability for aligning the optical axis dependent on the deviation that has been detected, U.S. Pat. No. 6,842,500 describes the concept of designing the collector mirror to be position-adjustable, so that by controlling the collector mirror it is possible to correct a misalignment of the first and second partial systems. As a sensor concept, it is proposed in U.S. Pat. No. 6,842,500 to register the photo current which is induced by the incident light in the operating light path, for example on the surface of a folding mirror in the light path of the illumination system near the plane in which the reticle is arranged. In the arrangement according to U.S. Pat. No. 6,842,500, a change of the photoelectric effect which occurs on an optical element of the illumination device is always detected at the surface of the individual optical elements in the vicinity of the optical element which also reflects or transmits the incident light of the operating radiation.

An illumination system which is disclosed in WO 2004/031854 includes a first partial optical system and a second partial optical system, wherein the first partial optical system includes the light source and the second partial optical system includes at least one field facet mirror. According to a concept disclosed in WO 2004/031854, sensors are placed on an optical element which is arranged in or near the field plane, for example on the field facet mirror, for the purpose of adjusting the source module and the downstream optical components. WO 2004/031854 also discloses a pupil facet mirror with detectors arranged on it which can be configured as quadrant detectors.

Further illumination systems with detectors are presented in EP A 0 421 746 and in EP A 1 901 125, with the latter reference showing the detectors arranged on an aperture stop.

SUMMARY

In some embodiments, the disclosure provides an optical element which provides a stable photoelectrical signal even in long-term operation and which, when used in an optical unit such as for example a microlithography projection exposure apparatus, can be employed for the purpose of performing adjustments.

In certain embodiments, the disclosure provides an illumination system which makes it possible in a simple manner to ensure the most uniform illumination possible in the field plane and low telecentricity errors in the exit pupil. Particular attention is devoted to avoiding errors that are due to misalignment of a source module and downstream optical components.

The disclose also provides a projection objective which can be securely adjusted.

An optical element can include a first region which reflects or transmits the light falling on the optical element. The optical element can also include at least one second region which is adjacent or leaves a small gap to the first region and at least partially surrounds the first region. The second region is designed to be at least in part electrically conductive and electrically insulated from the first region. If the optical element is for example a part of an illumination system, a projection objective, or a microlithography projection exposure apparatus, then the first region receives the so-called operating radiation. The operating radiation is the light which is used for the illumination of an area in a field plane or of the exit pupil in an illumination system, or the radiation which in a projection objective projects an object in an object plane into an image in an image plane. For systems that operate with EUV light, the operating radiation lies in the range of 5 to 30 nm, such as between 11 and 14 nm (e.g., at 7 nm or at 13.5 nm), but no limitation is implied by these numerical values. When an operating radiation with wavelengths shorter than 100 nm is used, particularly in the EUV range, the first region is designed to be reflective. The first region in this case reflects the incident light onto a further optical component such as a mirror, or for example into the field plane. In the case of an operating radiation with wavelengths for example larger than or equal to 193 nm, the first region which receives the incident light is designed to be transmissive. The second region is adjacent to and partially surrounds the first region. The second region is designed to be electrically conductive, meaning that the light which falls into this region causes a photoelectric effect resulting in a detectable electrical current. If the system is completely adjusted, none of the operating radiation will fall onto the second region except for stray radiation. The operating radiation falls exclusively onto the first region of the optical element. If the system is only slightly out of adjustment, a part of the light of the operating radiation falls onto the second region of the optical element, where it can be detected photoelectrically. As the first region is selected so that it is to a large extent totally illuminated when the system is completely adjusted, a slightly deficient adjustment will immediately lead to a photo current in the second region. The optical element is therefore very sensitive to out-of-adjustment conditions, as the adjustment error of the optical element can be measured directly at the optical element itself.

In some embodiments, the second region can completely enclose the first region. In certain embodiments, the second region is subdivided into a plurality of sectors, for example a first and a second sector. Subdividing the second region into sectors makes is possible to detect not only the presence or absence of an adjustment defect but also to gain information about the direction of the adjustment deviation.

In some embodiments, the optical element includes a carrier element and a large number of first regions that are arranged on the carrier element in the form of mirror facets. At least one electrically conductive second region is arranged outside of the mirror facets on the carrier element. The electrically conductive second region is electrically insulated against the carrier element as well as against the mirror facets. As a result of this arrangement, short-wavelength light which is not falling on the individual mirror facets will excite secondary electrons in the area of the carrier element that is not covered by the mirror facets. If the area is electrically conductive, made for example of a metallic surface, it is possible to connect this area for example to a current-measuring instrument and thereby measure a drain current.

In certain embodiments, the carrier material on which the mirror facets are arranged is an insulating material. Each mirror facet can be surrounded by an electrically conductive region, leaving some space in between. This ensures that the area surrounding each mirror facet is insulated against the mirror surface of the mirror facet as well as against the carrier element itself. It can be desirable for the electrically conductive regions to have as small a distance as possible from the individual mirror facets, i.e. that they are adjacent to the mirror facets. A small distance, in the present context, means that the distance is less than one-tenth of the median dimension of the first region. On the other hand, care should be taken that the distances are not too small, as the first and the second region need to be electrically insulated from each other. Accordingly there is a lower limit for the distances. A lower limit would be for example of the order of one millimeter. If space is scarce, it is also possible to realize narrower distances with an appropriate choice of insulating materials, for example with a lower limit of 0.5 mm or even 0.1 mm. The median dimension for example in the case of a circular shape of the mirror facet is considered to be the diameter of the mirror facet. In such a case, even very small out-of-adjustment conditions can be detected by the photo current signal which is received.

However, this does not exclude the possibility of conductive regions having a larger distance, as will be described hereinafter. According to the disclosure, the conductive regions are arranged on the optical element itself in an area which is not illuminated by the operating radiation in an optical system, meaning that they lie outside of an optically active area.

In some embodiments, a large number of conductive regions are arranged on the insulating carrier element around one or more mirror facets. The conductive regions can be configured for example as electrically conductive stripes. Based on the spatial arrangement of the stripes, it is possible to make a locally differentiated measurement.

It can be desirable for the electrically conductive regions to belong to at least one of the mirror facets form a quadrant detector. This allows additive and subtractive combinations of signals, which are used again for the purpose of determining the misalignment or the centering error.

The electrically conductive regions can be formed of a metallic material or a semiconductor material. Exemplary materials are Ru, Pd, Ir, Be, Zr, Ti, Ag, Au, Mo, Si.

In some embodiments, the optical element is a facetted optical element, such as a pupil facet mirror. In double-facetted illumination systems as described in U.S. Pat. No. 6,198,793, pupil facet mirrors are placed in or near the pupil plane of an illumination system. The illumination system described in U.S. Pat. No. 6,198,793 is in particular the kind of illumination system used for an EUV microlithography projection exposure apparatus that uses operating wavelengths shorter than 193 nm, specifically in the range between 5 nm and 30 nm. Special operating wavelengths in this range are 7 nm, 11 nm and 13.5 nm. In illumination systems for EUV lithography the facetted optical elements are the kind of optical elements that include a plurality of mirror facets, so-called multi-mirror arrays. A double-facetted illumination system as disclosed in U.S. Pat. No. 6,198,793 includes at least two facetted optical elements, i.e. a first facetted optical element which is referred to as field facet mirror and a second facetted optical element, the aforementioned so-called pupil facet mirror.

While in double-facetted illumination system with two facetted optical elements the second mirror in the light path from the light source to an illuminated object is configured according to the present disclosure, the facetted optical element in accordance with the disclosure could, as an alternative possibility, also be a field facet mirror or a so-called specular reflector, as is disclosed in US 2006/0132747 A. The specular reflector is an optical element which is desirably not arranged in a field plane nor in a pupil plane. The specular reflector simultaneously illuminates the field and the exit pupil of an illumination system and includes several hundred individual mirror facets. The entire contents of U.S. Pat. No. 6,198,793 and US 2006/0132747 A are incorporated by reference herein.

Other optical elements in an illumination system or a projection objective are for example grazing-incidence mirrors or normal-incidence mirrors. The second region which is designed as an electrically conductive region is always the area which is not used by the light of the operating radiation e.g. in an image-projection light path or an illumination light path (i.e. the area which lies outside of the optically active area).

Besides the optical element, the disclosure also provides an illumination system, a projection objective, or a microlithography projection exposure apparatus with such an optical element.

In some embodiments, the illumination system includes a light source which illuminates an exit pupil in an exit pupil plane. The illumination system further includes an optical element which is arranged in a light path from the light source to the exit pupil.

Desirably, the optical element is configured as a facetted optical element with a large number of pupil mirror facets and is arranged in or near the exit pupil plane and/or in a plane that is conjugate to the exit pupil plane.

An optical element of this kind includes a carrier element and a large number of pupil facets that are arranged on the carrier element, as well as at least one electrically conductive region which is arranged on the carrier element outside of the pupil facets, wherein the electrically conductive region is electrically insulated against the carrier element as well as against the pupil facets. An illumination system with a pupil facet mirror is disclosed for example in U.S. Pat. No. 6,198,793.

In certain embodiments, an illumination system includes a light source as well as a single optical element with a carrier element and a large number of mirror facets which are arranged on the carrier element. The optical element includes a conductive region which is arranged outside of the mirror facets. The optical element illuminates the field plane as well as the pupil plane, as is described in US 2006/0132747 A, and is desirably not arranged in a field plane nor in a plane that is conjugate to the field plane, and also not in a pupil plane nor in a plane that is conjugate to the pupil plane.

An illumination system according to U.S. Pat. No. 6,198,793 can include a further optical element with a large number of field facets. The field facets receive the light of the light source and split it up into a large number of ray bundles. The large number of ray bundles is directed to the optical element, which is also referred to as facetted pupil facet mirror. According to the disclosure, the pupil facet mirror includes at least one conductive region lying outside of the pupil facets. Each ray bundle that originates from a field facet forms a secondary light source.

The facetted pupil facet mirror is arranged in or near the plane in which the secondary light sources are formed. Each secondary light source forms an illumination spot in the plane in which the facetted pupil facet mirror lies. If the light source and the optical components of the illumination system that follows the light source are adjusted in relation to each other, then the individual illumination spots cover only the individual pupil facets. If the systems are out of adjustment, the illumination spots cover not only the individual pupil facets but also areas lying next to the pupil facets. According to the disclosure, secondary electrons are generated in the areas adjacent to the pupil facets, so that the drain current of the secondary electrons can be measured. From the magnitude of the drain current, one can deduce the magnitude of the adjustment error. The system is completely adjusted if no drain current stemming from the useful light is measured, except for currents caused by stray light, because only the pupil facet mirrors—but not any areas adjacent to them—are now covered by the illumination spots. In this case, no secondary electrons are generated by the useful light. For an individual with a working knowledge of the pertinent field it will be evident that the adjustment concept which has been described above for double-facetted systems can also be applied to systems with specular reflectors or to any other adjustment in an optical system, for example in a projection objective.

Quite generally, a double-facetted illumination system includes, as disclosed for example in U.S. Pat. No. 6,198,793, a light source, which radiates light in the range of 5 nm and 30 nm, especially in the range of 11 nm and 14 nm, especially at 7 nm, 11 nm or 13.5 nm, as well as a first facetted element or first multi-mirror array arranged in the light path from the light source to a plane that is to be illuminated, and a second facetted element or second multi-mirror array located, relative to the direction of the light, downstream of the first facetted optical element. The second multi-mirror array can be configured as a facetted optical element according to the disclosure, having electrically conductive regions outside of the optical regions An arrangement of this kind allows a drift of the light source, especially a drift of the angular spectrum of the light source, to be detected. A drift of a light source or a drift of an angular spectrum of a light source is due to a change of the direction of emission intensity of the light source and eventually collector mirrors associated with the light source. To perform this function, the first multi-mirror array includes at least two mirrors which receive the light of the light source. The mirrors or mirror facets of the first multi-mirror element reflect the light of the light source into a first and at least a second bundle of light rays, and the angular spectrum of the light rays from the light source is split up into a first angular spectrum and at least a second angular spectrum. The first bundle of light rays and the second bundle of light rays then fall onto a first mirror facet and a second mirror facet of the second multi-mirror array which is arranged in the light path downstream of the first multi-mirror array. The first bundle of light rays can also be designated in short as first light bundle and the second bundle of light rays as second light bundle. The second multi-mirror array is configured as a facetted optical element in accordance with the disclosure, meaning that it includes an electrically conductive region which extends at least partially around the mirror facets. The electrically conductive region is insulated against the carrier element for the mirror facets as well as against the mirror facets. The mirrors or mirror facets of the second multi-mirror array are receiving in the local dimension the first and second angular spectra generated by the mirror facets of the first multi-mirror array. Now, if a drift of the light source manifests itself in the angular dimension, there will be a change in the first and second angular spectra generated by the mirror facets of the first element. This change is then detected in the local dimension on the second multi-mirror element. This means, in short, that a source drift in the angular dimension is detected in the local dimension of the mirror facets of the second multi-mirror array. It can be desirable to use an arrangement where the source drift in the angular dimension detected by the second multi-mirror array can be used as a control signal, for example in a control system with the capability to compensate the source drift in the illumination unit. This kind of compensation is possible for example if the mirrors or mirror facets of the first multi-mirror array are responsive to control, for example changing their tilt angles via piezo elements. Now, if a source drift is detected by the mirror facets of the second multi-mirror element, the change in the angular spectrum which occurs as a result of the drift can be compensated by a controlled actuation, for example a change of the tilt angle, of the respective mirrors which are arranged on the first facetted optical element. A control of this kind can also be designed in the manner of a feedback loop.

As an alternative to the second regions which are arranged at a small distance from the first regions, for example in the proximity of the pupil facets, it is also possible to generate photo currents that can be utilized for the adjustment by using areas that are distant from the first region. In a double-facetted illumination system it would for example be possible to generate a photoelectric signal for the adjustment by projecting illumination spots via the first facetted element onto specific radiation sensitive areas dedicated for this purpose which are formed on the optical element instead of individual pupil facets. This can be accomplished in a double-facetted system by putting additional field facets on the field facet mirror or on the first facetted optical element, or by substituting radiation-sensitive areas for individual pupil facets. If the radiation-sensitive areas, i.e. the electrically conductive regions are divided into sections, for example four sections forming a quadrant sensor, it is possible by forming the difference signals of the individual quadrants and dividing each difference through the signal sum to generate for example an adjustment input information, which offers the following advantages for performing an adjustment:

The adjustment input information is also available if each individual pupil facet of the pupil facet mirror is completely filled with illumination.

The adjustment input information is independent of the absolute magnitude of the radiation.

In some embodiments, the illumination system includes a collector which in the light path from the light source to the exit pupil is placed ahead of the facetted optical element and which receives and collects the light from the light source.

The illumination system can be subdivided into a first partial optical system with at least the light source and a second partial optical system with at least the facetted optical element. The first partial optical system is also referred to as the source/collector partial system, including at least one light source and a collector. The second partial system includes all further components of the illumination system, including in particular the facetted optical element. It can be desirable for the first and the second partial system are optically separated by an intermediate focus and separated in regard to their respective pressure levels through appropriate technical approaches as are commonly used in vacuum systems. The optical element according to the disclosure in the second partial system allows control of the adjustment of the first partial system in relation to the second partial system. In order to control the adjustment with six degrees of freedom, there are at least six sensor involved, so that six adjustment inputs are generated. These sensors can be arranged on the optical element with pupil facets. As an alternative possibility, only some of the sensors are arranged on the optical element with pupil facets, while the rest of the sensors are arranged for example on the optical element with field facets. This has the advantage that a higher measurement accuracy is achieved. The adjustment can be performed via a positioning device for the light source and/or for the optical element.

An automatic adjustment is made possible if the illumination system includes a processing unit as well as position-setting unit, wherein the processing unit is electrically connected to the at least one electrically conductive region.

The processing unit can be structured in such a way that the measurement values of the electrically conductive region are evaluated automatically and that the processing unit is connected to at least one position-setting unit which serves to set the position of at least the light source and/or at least the optical element. A structure of this kind represents a feedback loop.

The illumination system is in this case structured so that based on the signals received from the conductive regions, the processing unit controls the position-setting device in such a way that the illumination spots of the large number of ray bundles will lie in the area of the pupil facets.

Besides the illumination system, the disclosure also provides a method for the adjustment of an illumination system, in particular for the field of EUV lithography. The method has the following steps:

Via the electrically conductive region, a signal is registered which represents the electron flow in the area of the electrically conductive regions;

The position-setting unit for at least the light source and/or the optical element is controlled in such a way that the signal generated from the electrons in the electrically conductive regions largely disappears and, accordingly, the illumination system is in alignment.

In order to adjust the systems relative to each other, the positioning device can shift and rotate the entire source module or the entire illumination module. Moving an entire module has the advantage that the alignment of the optical elements within the module is not affected. It is also possible to move a mirror element inside the modules, if the alignment of the optical axis of the module is not affected, or if it is brought back into alignment after the mirror has been moved. Rotating and shifting the mirror elements in essence has the effect that an intermediate image of the light source, for example between the first and the second partial system, is shifted, adjusted, and the direction of the radiation is corrected. As the mirror element can also be controlled while an exposure is taking place, such an arrangement allows an alignment or adjustment of the two partial systems during the exposure process. If the adjusting system has more than two axes of adjustment, the position and the direction of the ray bundle or bundle of rays can be adjusted independently of each other. This can be accomplished for example with a mirror with two rotary and two translatory axes, or also with two mirrors, where each of them has two rotary axes.

An exemplary device for adjusting a mirror element is shown in U.S. Pat. No. 4,490,041, the entire contents of which are incorporated by reference herein. In U.S. Pat. No. 4,490,041, the mounting arrangement of a mirror element is described which functions in such a way that by rotating the mirror about a unique center of rotation, the reflected ray—while changing its direction—continues to always meet the mirror surface at the same fixed location, meaning that the point of incidence of a ray of a ray bundle remains essentially constant when the mirror is being rotated. If a device as described in U.S. Pat. No. 4,490,041 is used as a position-setting device, the mirror element can be repositioned and rotated by this position-setting device in such a way that the direction and the position can be adjusted separately. To accomplish this purpose, the mirror element is supported so that it can be rotated about the center of rotation described in U.S. Pat. No. 4,490,041 which defines an axis of rotation. Errors in direction of the ray bundle for example in the area of the intermediate image, following detection by the detector described hereinabove, can now be corrected by a rotation about this unique center of rotation without thereby losing its lateral position. This opens a particularly simple way to realize an adjustment.

BRIEF DESCRIPTION OF THE DRAWINGS

The disclosure, which finds application in particular in an EUV projection exposure apparatus for use in microlithography, will hereinafter be described and illustrated through examples and figures, wherein:

FIGS. 3a and 3b illustrate a facetted optical element according to the disclosure, wherein the electrically conductive regions are arranged next to the mirror facets on a carrier plate of a facetted optical element with mirror facets.

DETAILED DESCRIPTION

Figure 1:
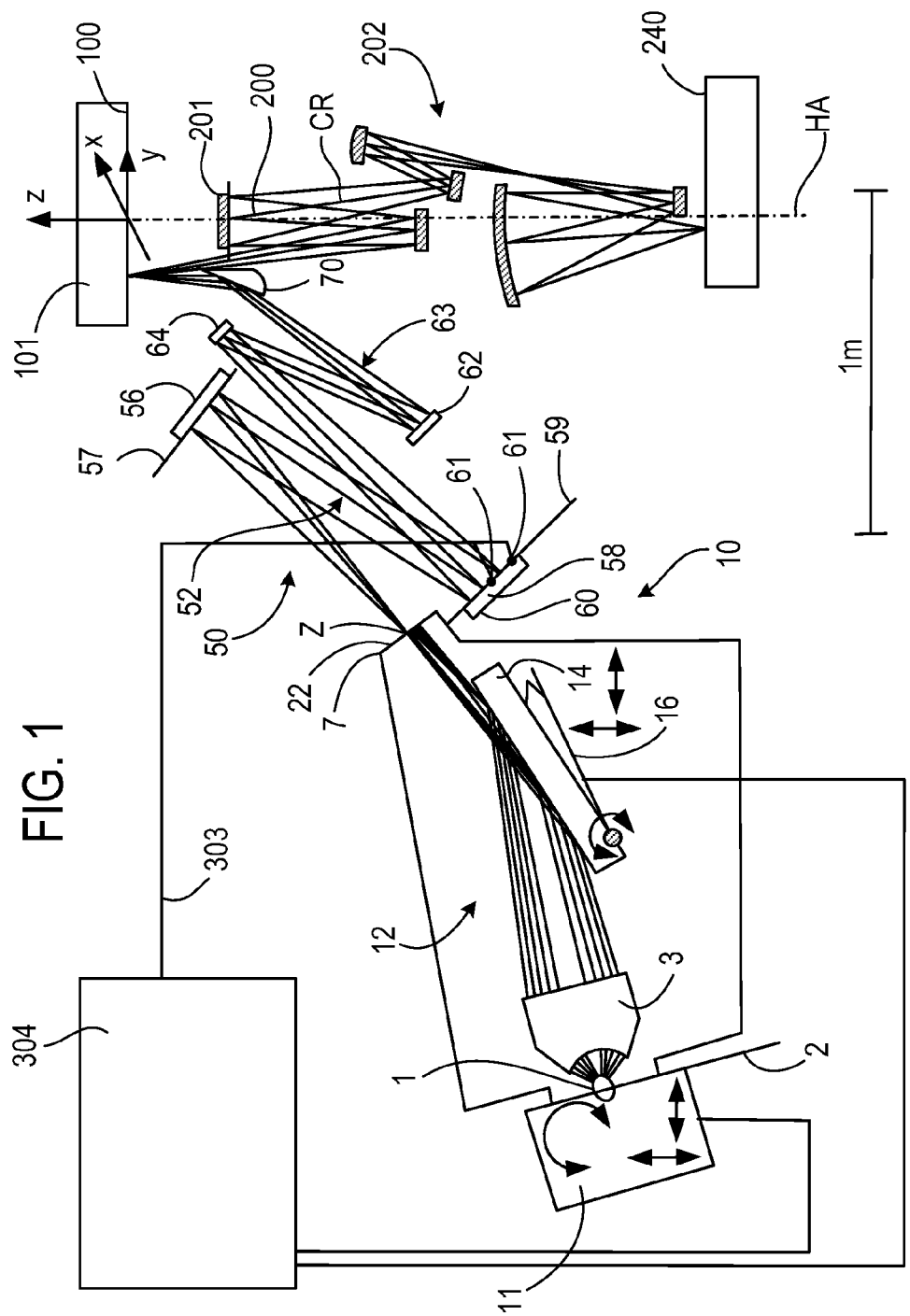
FIG. 1 represents an overall view of an EUV projection exposure apparatus which is equipped with a mirror element with a position-setting device.

FIG. 1 shows a projection exposure apparatus, in particular for operating wavelengths in the range of EUV radiation with a wavelength of 13.5 nm, wherein electrically conductive regions are arranged next to the raster elements on the carrier element of the optical element with pupil raster elements. The operating wavelengths is not restricted to 13.5 nm. An operating wavelength between 5 nm and 30 nm, such as a wavelength of 7 nm or 11 nm, can also be used. The EUV projection exposure apparatus includes a light source with a source plasma 1 emitting EUV radiation, and a light-gathering optical component, a so-called collector 3 configured as a nested collector according to WO 02/065482, the entire contents of which are incorporated herein by reference. The collector 3 projects an image of the light source 1 located in the object plane of the illumination system into an intermediate image Z of the light source 1 or into a secondary light source in a plane y that is conjugate to the object plane 2. A physical aperture stop 22 is arranged in or near the plane 7 that is conjugate to the object plane 2.

The light source 1 in the present example, which can be for example a laser plasma source or a plasma discharge source, is arranged in the object plane 2 of the illumination system. The intermediate image Z of the primary light source 1, which is also referred to as secondary light source, is situated in the plane 7 of the illumination system, which is conjugate to the object plane 2.

In the context of the present application, the first partial optical system of the illumination system 10 is understood to be the partial optical system extending from the light source 1 to the intermediate image Z of the light source 1.

Besides the collector 3, the first partial system 12, also referred to as source/collector unit, includes as a mirror element a grid element 14 and a position-setting device 16.

Such a grid element 14, which is also referred to as a spectral grid filter, is shown for example in US 2002/186811 A1, the entire contents of which are incorporated by reference herein. As described in US 2002/186811 A1, the focus for the first diffraction order falls into the plane 7 in which the aperture stop 22 is located, meaning that in the first order of diffraction, the collector and the grid element produce a nearly stigmatic image of the light source in the plane of the aperture stop, resulting in a secondary light source or intermediate image Z of the light source in the plane. All other orders of diffraction, for example the zero order, are blocked by the aperture stop 22, so that light of longer wavelengths, for example DUV light, cannot pass.

The illumination system 10 of the projection system further includes a second partial optical system 50 serving to shape and illuminate an annular field in the field plane 100 and to center the light that fills the entry pupil of the optical projection system to the best degree possible, as described in U.S. Pat. No. 6,438,199 B1, the entire contents of which are hereby incorporated by reference herein. Also shown in the drawing is the local x-y-z coordinate system in the field plane 100. As a mixing unit 52 to produce a homogeneous illumination of the field, the second partial optical system 50 includes a first optical component 56 with first raster elements and a second optical component 58 with second raster elements. The first and second raster elements are arranged, respectively, on a first and a second carrier element. In a reflective design configuration, the first optical component 56 with first raster elements is also referred to as field facet mirror and the second optical component 58 is referred to as pupil facet mirror. In addition to the mixing unit 52, the second partial optical system 50 further includes an optical image-projecting system 63 with two image-reflecting mirrors 62, 64 and a field-shaping grazing-incidence mirror 70.

The field facet mirror 56 with a large number of reflective field facets produces a large number of light source images. If an intermediate image Z of the light source is formed, as is the case here, the multitude of these light source images is referred to as tertiary light sources. The tertiary light sources lie in a plane 59 which is conjugate to the plane 2 of the light source and the plane 7 of the intermediate image Z. In a double-facetted illumination system as illustrated in FIG. 1, a pupil facet mirror 58 is arranged in or near the plane 59. The pupil facet mirror 58 includes a carrier element 60 on which a large number of pupil facets are arranged (see FIGS. 3*a* and 3*b*).

On the carrier element of the pupil facet mirror, at least one electrically conductive region 61 is arranged next to a pupil facet for the detection of out-of-adjustment conditions of, e.g., the first and second partial systems 12, 50. It can be desirable in this case to use a multitude of electrically conductive regions 61, for example in the form of a quadrant detector.

The optical image-projecting arrangement 63 which follows downstream in the light path from the light source 1 to the field plane 100 projects an image o the pupil facet mirror into the exit pupil of the illumination system which falls into the entry pupil 200 of the projection objective 202. The location of the entry pupil 200 of the projection objective is determined by the point where a principal ray CR of a ray bundle, which originates for example from the central field point (0,0) of the illuminated field in the field plane 100, intersects the optical axis HA of the projection objective. The entry pupil, which also represents an exit pupil, lies in an exit pupil plane 201.

The angles of inclination of the individual facets of the field facet mirror 56 and of the pupil facet mirror 58 are designed so that the images of the individual field facets of the field facet mirror are superimposed on each other in the field plane 100 of the illumination system and, accordingly, a largely homogenized illumination becomes possible for the structure-carrying mask 101 which lies in this field plane. The segment of the ring field is formed for example through the field-shaping grazing-incidence mirror 70 which is operated with a shallow angle of reflection. In an alternative embodiment, the field facets themselves can simply have the shape of the field to be illuminated, i.e., they can be ring-segment-shaped.

The structure-carrying mask 101 in the field plane 100, also referred to as reticle, is projected vi a projection objective 202 into the image plane 204 of the field plane 100. The projection objective is a 6-mirror projection objective as disclosed for example in U.S. Pat. No. 6,353,470, the entire contents of which are incorporated by reference herein.

Arranged in the image plane 204 of the projection objective is the exposure object, for example a wafer.

According to the disclosure, at least one electrical region 61 which serves to detect a position-adjustment error, i.e. a misalignment, is arranged on the carrier plate 60 of the pupil facet mirror 58. A detail view of the electrically conductive regions 61 arranged on the carrier element is shown in FIGS. 3*a* and 3*b*. The signals of the sensors are transmitted for example through an electrical connection 303 to the position-setting and control unit 304. In the position-setting and control unit, the signal generated by the secondary electrons is compared for example to the signal of an adjusted system. Dependent on the deviation that was found, the grid element 14 is rotated via the positioning device 16 about the rotary axis RA shown in the drawing, or shifted along the local y-axis shown in the drawing. In an illumination system with an intermediate image Z, the latter can thus be shifted in its position, and the first and second partial systems can be adjusted in their directions relative to each other, as illustrated in FIGS. 2*a* to 2*d*.

Figure 4:
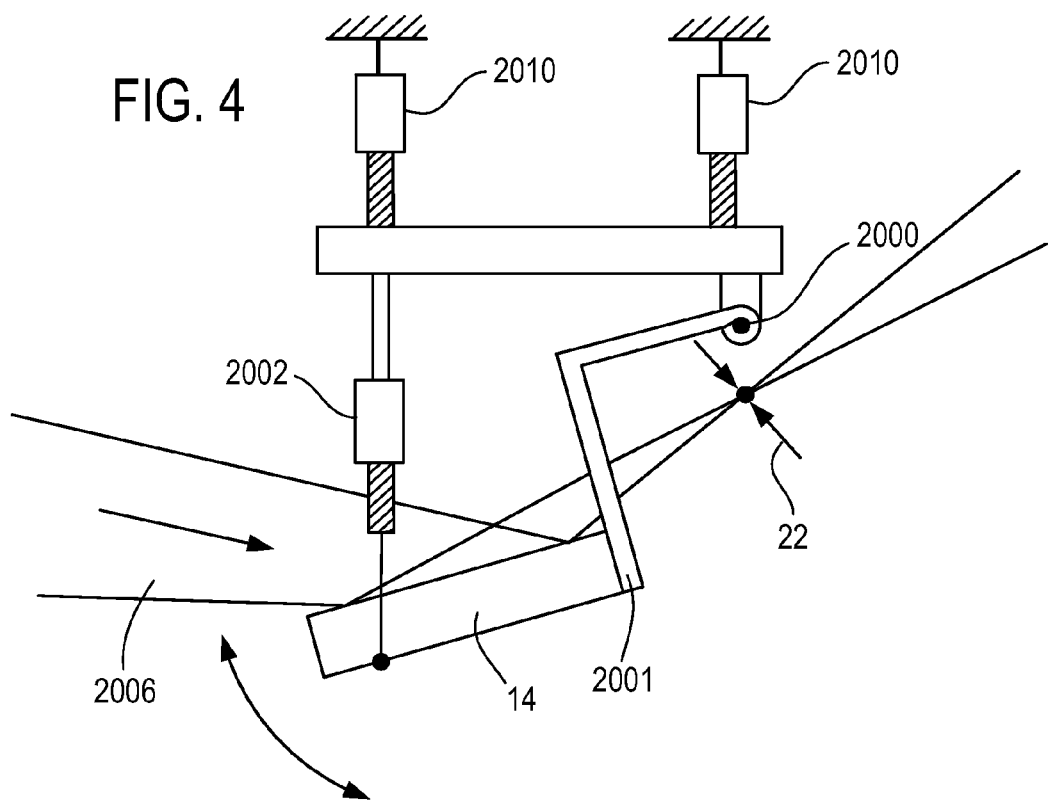
FIG. 4 represents a side view of an adjustment device for the spectral grid filter, which allows the rotary adjustment and the lateral adjustment in the intermediate focus to be uncoupled from each other.

An embodiment of a position-setting device 16 is illustrated in FIG. 4.

In an alternative embodiment, it is also possible that the position of the source plasma 1 is designed to be adjustable instead of the grid element 14, which means that the source is made position-adjustable via mechanical and/or electrical components of the source 11, which is of particular advantage if the source plasma 1 changes its location during operation as a result of aging. It can be desirable to use a plurality of components designed so that they can be manipulated, for example the source 11, the grid element 14, or the entire source-collector unit 12.

The illumination system shown in FIG. 1, which is intended in particular for lithography at wavelengths shorter than 193 nm, for example in the range of EUV wavelengths between 5 nm and 30 nm, is a so-called double-facetted illumination system with a first multi-mirror array, the field facet mirror 56, and a second multi-mirror array, the pupil facet mirror 58. As described above, each mirror facet of the first multi-mirror array receives a part of the angular spectrum of the light source 1. Associated with each mirror facet of the first multi-mirror array, i.e. with each field facet, is an angular spectrum and a bundle of light rays. The bundle of light rays belonging to each field facet falls on a pupil facet associated with the field facet. If the light source exhibits an angular drift but the system is otherwise in correct adjustment, then the signal on the second optical multi-mirror array 58 will change. This means that there is a change in the signal on the pupil facet mirror associated with the respective field facet mirror. If the field facet mirror 56 is of a special configuration, for example with mirror facets that are individually adjustable in their positions relative to the carrier plate, or with adjustable field facet mirrors, then the angular drift of the light source can be compensated by changing the positions of the respective field facet mirrors. This is illustrated in FIGS. 2*e* and 2*f*. If there is an additional adjustment defect in the system, where the first partial system is out of adjustment relative to the second partial system, the signals that are present at the second multi-mirror array can be superimposed on each other. In such a case, the signals can be separated by an appropriate analysis, and an adjustment of the system can be made, followed by a compensation of the angular drift of the light source 1.

Figure 2A:
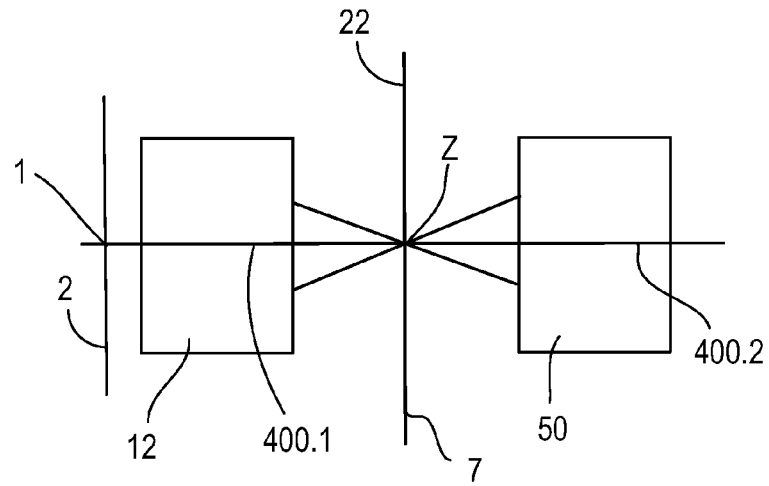
FIGS. 2a-2d illustrate the principal nature of adjustment errors in an EUV illumination system that is subdivided into two partial optical systems.

FIGS. 2*a* to 2*d* show possible out-of-adjustment conditions of an illumination system which has two partial systems. In this illumination system, an intermediate image Z of the primary light source is formed. The intermediate image Z divides the illumination system into a first partial system 12 and a second partial system 50. FIG. 2*a* shows the first partial system 12 in the adjusted condition relative to the second partial system 50. The optical axes 400.1, 400.2 of the first and the second partial system agree with each other, and the intermediate image Z of the light source falls into a plane 7 that is conjugate to the plane 2 in which the light source 1 of the illumination system is positioned. In the plane 7 that is conjugate to the light source plane 2, there can be a physical aperture 22 stop arranged.

Figure 2B:
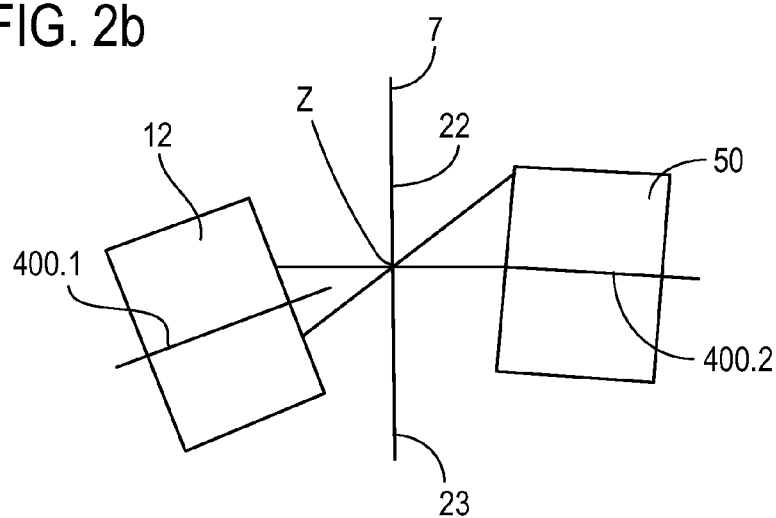
Figure 2C:
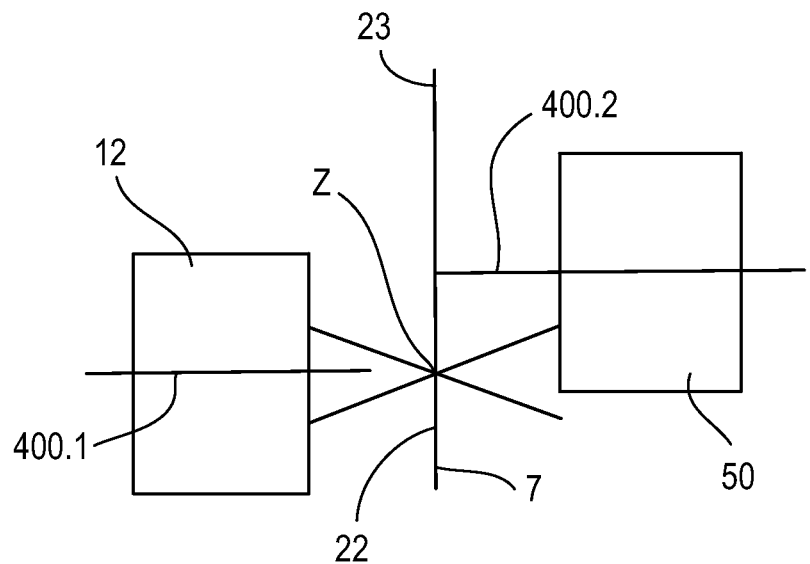
Figure 2D:
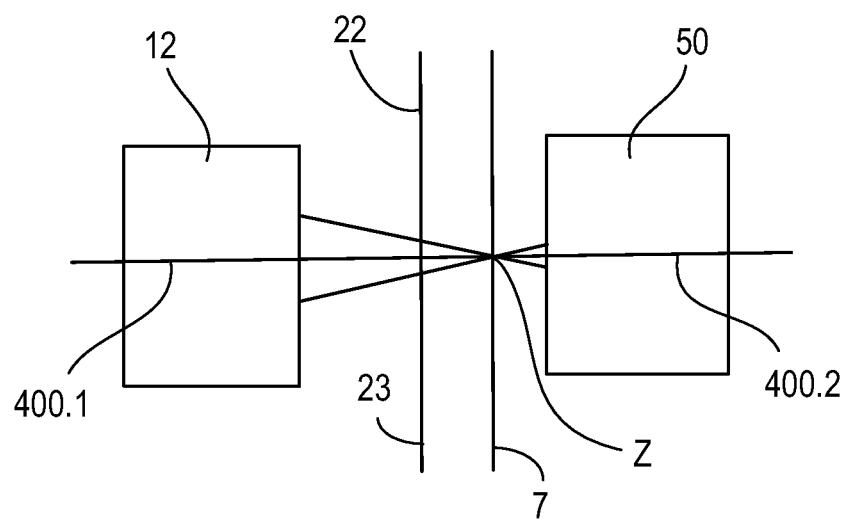
Figure 2E:
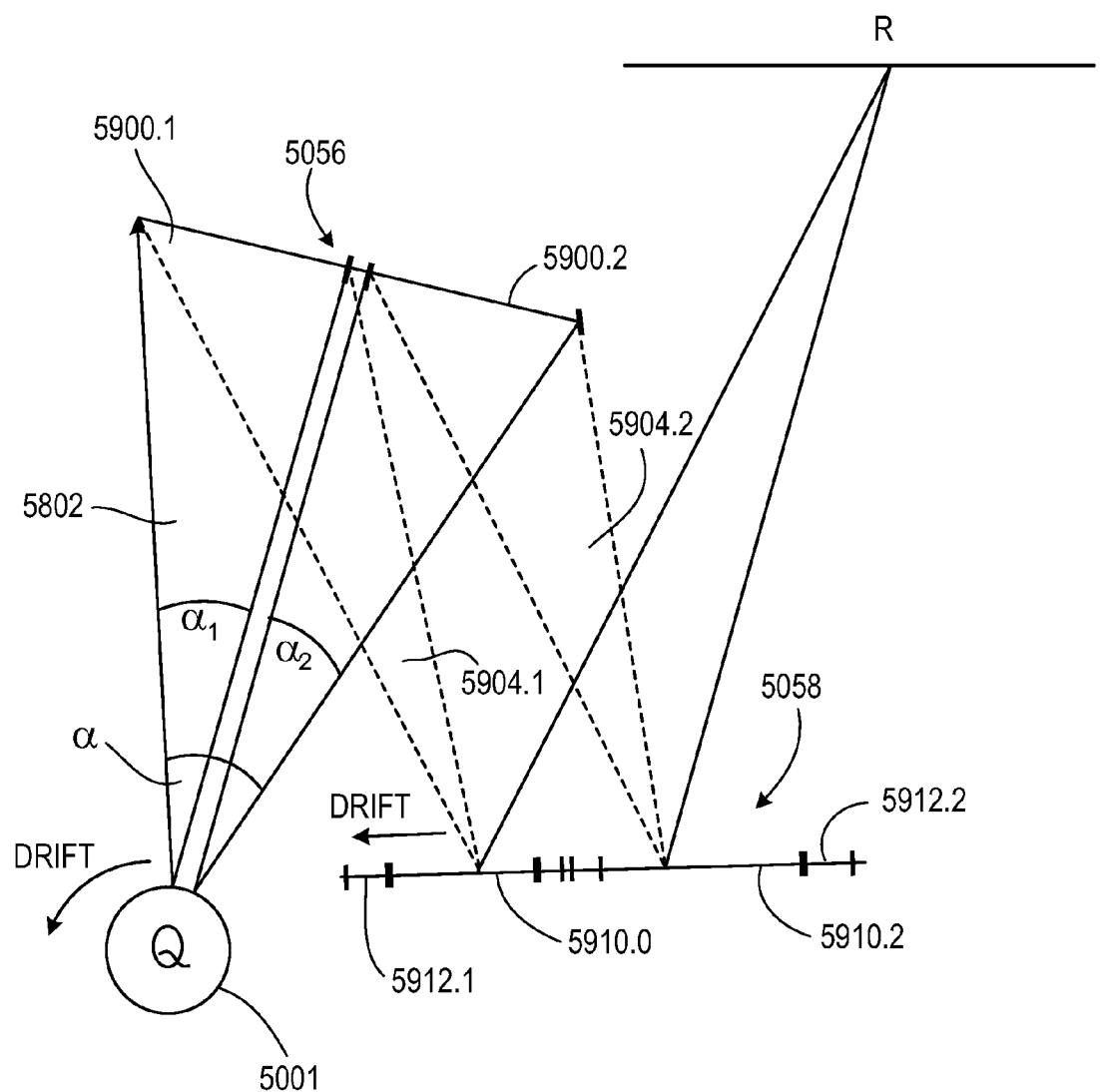
FIG. 2e illustrates the principal nature of an illumination system with two facetted optical elements, i.e. a first multi-mirror array and a second multi-mirror array serving to detect an angular drift.
Figure 2F:
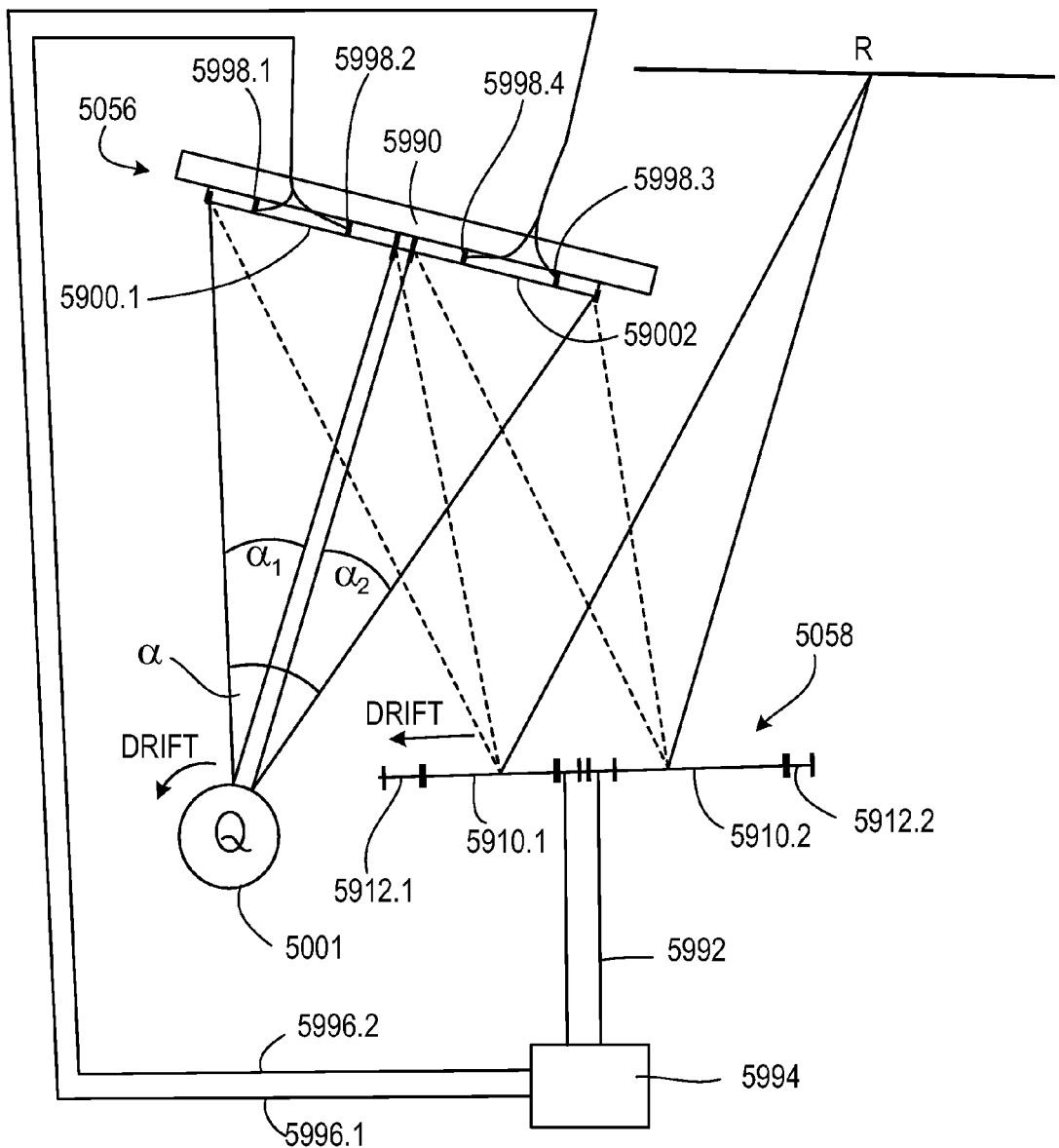
FIG. 2f illustrates the principal nature of a feedback loop for the compensation of a drift of the light source.

FIGS. 2*b* to 2*d* illustrate the three possible out-of-adjustment conditions of the first and second partial systems 12, 50 of the illumination system.

FIG. 2*b* shows a directional adjustment error of the first and second partial systems 12, 50. A directional adjustment error means that while the plane 7 in which the intermediate image Z is located coincides with the plane 23 in which the physical aperture stop is arranged, the optical axis 400.1 of the first partial system is inclined at an angle against the optical axis 400.2 of the second partial system. With the help of a detector arranged at a distance from the intermediate image plane 7, it is possible to determine the tilt angle of the optical axis 400.1 of the first partial system relative to the optical axis 400.2 of the second partial system and thus to bring the first optical axis 400.1 into alignment with the second optical axis, i.e. to adjust the system in regard to the direction of the radiation. The term "distance" as used herein means the distance traveled by the light from the intermediate image plane 7 to the point of incidence on the detector. The detector is in this case the conductive region 61 on the pupil facet mirror 58.

FIG. 2c illustrates the case of a lateral position error of the first partial system relative to the second partial system 50. In this case, while the intermediate image Z of the light source falls into the intermediate image plane 7, it does not intersect this plane in centered agreement with the optical axis 400.2 in which the physical aperture stop 22 is arranged, meaning that the aperture stop blocks the passage of radiation into the second partial system. This so-called lateral position adjustment error between the first and second partial systems 12, 50 can be detected with the help of the conductive region on the pupil facet mirror. In a system that is adjusted, the pupil facet mirror is arranged in the conjugate plane 59. With the conductive area 61, the size and position of a resulting light spot can be detected.

FIG. 2d illustrates the case of the axial position error of the first partial system relative to the second partial system. In this case, the intermediate image Z of the light source falls into an intermediate image plane 7, which in the light path from the light source to the field plane falls for example behind the aperture stop plane 23 in which the physical aperture stop is arranged. This means that in this case the intermediate image plane 7 no longer coincides with the aperture stop plane 23. This so-called axial position adjustment error between the first and the second partial system 12, 50 can be detected via at least one detector which is arranged in a plane 59 that is conjugate to the intermediate image plane 7 in a system that is in adjustment. Thus, the light spot in the conjugate plane is minimized in size when the system is in ideal adjustment. With an axial adjustment error, the size of the light spot will increase and will thus be detectable. According to the disclosure, the pupil facet mirror containing conductive regions is the detector for axial position adjustment errors.

When adjusting a system that is out of adjustment in regard to position as well as direction, it can be desirable as a first step to make a direction adjustment. As a result, the optical axis 400.1 of the first partial system 12 and the optical axis 400.2 of the second partial system will be in alignment with each other. In a subsequent second step, a position adjustment is made. Following this, the process can be repeated until a desired state of adjustment has been achieved.

FIGS. 2e and 2f illustrate the principal nature of a double-facetted illumination system with two multi-mirror arrays or two facetted optical elements in which an angular drift (DRIFT) of a light source 5001 occurs and a way to compensate this angular drift.

In the illumination system illustrated in FIG. 2e, components that are analogous to those in FIG. 1 are identified by the same reference numerals raised by 5000. The illumination system according to FIG. 2e includes a light source 5001 and a first facetted optical element or first multi-mirror array 5056. The first multi-mirror array 5056 can be arranged in or near a field plane or a plane that is conjugate to the field plane, and therefore this first multi-mirror array is also referred to as field facet mirror 5056. The first multi-mirror array in the illustrated embodiment has as an example two mirrors, i.e. a first mirror 5900.1 and a second mirror 5900.2. The first multi mirror array is not restricted to two mirrors 5900.1, 5900.2. For example the first multi mirror array in WO 02/27401 has about 212 field acts and the second multi mirror array 212 pupil facets. The field facets in WO 02/27401 have rectangular shape and are arranged in columns and rays. The pupil facets in WO 02/27401 are circular in shape. The bundle of rays 5902 originating from the light source 5001 has an aperture angle $\alpha$. Of the bundle of rays 5902 of the light source 5901, the first mirror 5900.1 receives a first angular spectrum with an angle $\alpha_1$, and this incoming angular spectrum is reflected in a first bundle of rays 5904.1 onto a first mirror 5910.1 of the second multi-mirror array 5058. The second mirror 5900.2 receives out of the bundle of rays 5902 of the light source 5901 a second angular spectrum with an angle $\alpha_2$, and this incoming angular spectrum is reflected in a second bundle of rays 5904.2 onto a second mirror 5910.2 of the second multi-mirror array 5058. Each mirror 5910.1, 5910.2 of the second multi-mirror array 5058 is surrounded by an electrically conductive region 5912.1, 5912.2 as shown for example in FIG. 3a or 3b. If the system is in correct adjustment and there is no drift present, then the bundles of rays 5904.1, 5904.2 fall on the mirrors 5910.1, 5910.2. In the presence of a drift, the ray bundles 5904.1, 5904.2 will fall on the electrically conductive regions 5912.1, 5912.2 that lie adjacent to the mirrors. In the electrically conductive regions, signals are generated as a result of the angular drift which can be used to change the positions of the mirrors 5900.1, 5900.2 relative to the incident bundle of rays 5902 and thereby to compensate for the angular drift of the light source.

A control concept of this kind is illustrated in FIG. 2f. Components identical to those in FIG. 2e are identified by the same reference symbols. The two mirrors 5900.1, 5900.2 of the first multi mirror array 5056 in FIG. 2f are mounted with a degree of mobility on a carrier plate 5990. The mirrors 5900.1, 5900.2 and the carrier plate 5990 in the example shown in FIG. 2f together form the first multi-mirror array 5056. Now, if a signal that is caused by an angular drift of the light source is detected by the conductive regions 5912.1, 5912.2 of the second multi-mirror array 5058, this signal will be transmitted through the line 5992 to a control-/regulation unit 5994. The control-/regulation unit 5994 in turn controls by way of lines 5996.1, 5996.2 the individual mirrors 5900.1, 5900.2 of the first multi-mirror array 5056. This causes the mirrors 5900.1, 5900.2 to be set into a different position, for example by changing their tilt angles, whereby the angular drift of the light source 5001 is compensated. To change the position of the mirrors 5900.1, 5900.2, piezo-element 5998.1, 5998.2, 5998.3, 5998.4 or so called micro actuators can be used. Each of the piezo-elements is connected via lines 5996.1, 5996.2 to the control mit 5994. The piezo-elements 5998.1, 5998.2, 5998.3, 5998.4 are generally speaking position setting devices. Instead of piezo-elements the position setting devices can use also Lorentz forces.

In FIG. 3a, a first embodiment of a pupil facet mirror is shown, which is identified by the reference numeral 58 in FIG. 1. The pupil facet mirror includes a carrier element 1000. In this example, a total of eight pupil facets are arranged on the carrier element. The pupil facets in general have a round shape corresponding to the shape of the illumination spots in the plane in which the pupil facet mirror is arranged. The individual pupil facets, which are configured as reflective pupil facets, are identified by the reference symbols 1002.1, 1002.2, 1002.3, 1002.4, 1002.5, 1002.6, 1002.7, 1002.8.

Each of the pupil facets 1002.1, 1002.2, 1002.3, 1002.4, 1002.5, 1002.6, 1002.7, 1002.8 is surrounded by an insulating area 1004.1, 1004.2, 1004.3, 1004.4, 1004.5, 1004.6, 1004.7, 1004.8, respectively. The insulating areas are separated by a gap from the respective pupil facets. An electrically conductive layer, for example a metallic layer 1006.1, 1006.2, 1006.3, 1006.4, 1006.5, 1006.6, 1006.7, 1006.8, is deposited on the insulating areas. Now, if due to an out-of-adjustment condition, an illumination spot of the secondary light source migrates out of the area that is covered by the respective pupil facet, this will cause an emission of secondary electrons on the surrounding metallic material which constitutes the respective conductive area 1006.1, 1006.2, 1006.3, 1006.4, 1006.5, 1006.6, 1006.7, 1006.8. As a result, a so-called drain current will flow through the connector lead 1012.1, 1012.2, 1012.3, 1012.4, 1012.5, 1012.6, 1012.7, 1012.8 associated with the respective area. The magnitude of the drain current represents a measure for the extent to which the illumination deviates from an ideal illumination. In the case where the system is in complete adjustment, the illumination spots will illuminate only those areas that are covered by the individual pupil facets. In this case, there will be absolutely no secondary electron signals that could be measured.

The conductive areas 1006.1, 1006.2, 1006.3, 1006.4, 1006.5, 1006.6, 1006.7, 1006.8, in this case the ring-shaped metal-covered areas surrounding the respective pupil faces, are insulated again from the carrier plate by an insulating material 1014.1, 1014.2, 1014.3, 1014.4, 1014.5, 1014.6, 1014.7, 1014.8. In the embodiment according to FIG. 3*a*, each pupil facet is shown with only one conductive area 1006.1, 1006.2, 1006.3, 1006.4, 1006.5, 1006.6, 1006.7, 1006.8 which receives the signals and concentrically surrounds the pupil facets. It would also be conceivable to have several concentric rings of a conductive material deposited on an insulating material surrounding the pupil facet. Such an arrangement would have the advantage that a better topographical resolution could be achieved with it.

FIG. 3*b* shows for an individual pupil facet 1040 which is representative for the multitude of pupil facets 1002.1, 1002.2, 1002.3, 1002.4, 1002.5, 1002.6, 1002.7, 1002.8 which are arranged on a pupil facet mirror as shown FIG. 3*a*, how a plurality of conductive areas can be arranged around a pupil facet. Each pupil facet 1040 is surrounded in this example by a total of eight conductive areas. The pupil facet 1040 itself is arranged on an insulating plate 1050 which, in turn, is arranged on the carrier element which in FIG. 3*a* is identified by the reference numeral 1000. The eight conductive areas are identified as 1020.1, 1020.2, 1020.3, 1020.4, 1020.5, 1020.6, 1020.7 and 1020.8. If an illumination spot migrates out of the area of the pupil facet mirror, an electrical signal will be detected in the respective conductive area which is in this case configured as a metal strip. As the conductive areas surround the individual pupil facet in the manner of a quadrant detector, it is possible with the embodiment according to FIG. 3*b* to detect a misalignment with topographical resolution. Each of the eight conductive areas is again connected through a connector line 1030.1, 1030.2, 1030.3, 1030.4, 1030.5, 1030.6, 1030.7, 1030.8 to a measuring instrument which measures the drain current. Instead of the eight conductive areas shown in the drawing, one could also envision a larger number of conductive areas. This would increase the resolution. It is also feasible to have fewer conductive areas, for example four conductive areas forming a quadrant detector.

In a quadrant detector each conductive area is associated with a signal current $I_1$, $I_2$, $I_3$, $I_4$. Based on these measured quantities I1 to I4, one can calculate the asymmetry signals $$A_1 = \frac{I_1 - I_3}{I_2 + I_4}$$

$$A_2 = \frac{I_2 - I_4}{I_1 + I_3}$$

and the summation signals $$S_1 = I_1 + I_3$$

$$S_2 = I_2 + I_4$$

From this information, it is possible to determine for example the lateral position of a system that is out of adjustment. There are also other possible ways of calculating the position.

FIG. 4 shows an example of a position-setting device 16, which in accordance with the principles presented in U.S. Pat. No. 4,490,041 serves to adjust the position of the intermediate image Z of a light source based on the signals received.

The position-setting device includes a mirror element which can take the form of a grid 14. Via an angular bracket, the mirror element is mechanically connected to a rotary axis 2000. Via the spindle drive 2002, the mirror element can be rotated about the rotary axis 2000.

Accordingly, the spindle drive 2002 is the actuator that controls the rotation. The incident light bundle 2006 is diffracted by the grid element and the collector unit in the direction of the first-order diffraction and focused into an intermediate image Z of the light source. Also shown in the drawing is the aperture stop 22. When the actuator for the rotation is adjusted, the position of the intermediate image in the intermediate image plane always remains unchanged. The spindle drives 2010 are provided as actuators for translatory movements. As described hereinabove and in U.S. Pat. No. 4,490,041, the adjustment device shown here allows the translatory movement to be uncoupled from the rotary movement for the adjustment of the intermediate focus.

With this disclosure, an illumination system is disclosed for the first time, wherein the state of adjustment of an illumination system can be determined and monitored in a simple manner. This ensures that the illumination of the mask remains constant with regard to time and location and that the illumination of the pupil is centered.

Furthermore in a special embodiment an angular drift of a light source can be compensated for.

What is claimed is:

1. An optical element, comprising:
   a carrier element;
   a mirror facet supported by the carrier element; and
   a region that is at least partially electrically conductive to produce an electrical current when exposed to EUV radiation,
   wherein:
     the region is supported by the carrier element;
     the region is electrically insulated from the carrier element;
     the region is separated from the mirror facet;
     the region is electrically insulated from the mirror facet; and
     the region at least partially surrounds the mirror facet.

2. The optical element according to claim 1, further comprising an additional mirror facet supported by the carrier element.

3. The optical element according to claim 1, wherein:
   the optical element comprises a plurality of mirror facets;

the optical element comprises a plurality of regions that are at least partially electrically conductive to produce an electrical current when exposed to EUV radiation;

each mirror facet is supported by the carrier element;

each region is supported by the carrier element;

each region is electrically insulated from the carrier element;

each region at least partially surrounds a corresponding mirror facet;

each region is separated from its corresponding mirror facet; and each region is electrically insulated from its corresponding mirror facet.

4. The optical element of claim 3, wherein each mirror facet is at a center of its corresponding region.

5. The optical element of claim 3, wherein each region is concentrically disposed with respect to its corresponding mirror facet.

6. The optical element according to claim 1, wherein the region completely surrounds the mirror facet.

7. The optical element according to claim 1, wherein the region comprises first and second electrically conductive sectors.

8. The optical element according to claim 7, wherein the first electrically conductive sector is electrically insulated from the second electrically conductive sector.

9. The optical element according to claim 1, wherein the region comprises at least four electrically conductive sectors that form a quadrant detector.

10. The optical element according to claim 1, further comprising a current-measuring device electrically connected to the region.

11. The optical element according to claim 1, wherein the region comprise a material selected from the group consisting of a metallic material and a semiconductor material.

12. The optical element according to claim 1, wherein the region comprises a material selected from the group consisting of Ru, Pd, Ir, Be, Zr, Ti, Ag, Au, Mo and Si.

13. The optical element according to claim 1, wherein the mirror facet is capable of reflecting light having a wavelength that is shorter than 400 nm.

14. The optical element according to claim 1, wherein, when the optical element is present in a microlithography projection exposure apparatus, the region does not produce any stray light that is detrimental to an optical imaging process performed with the microlithography projection exposure apparatus.

15. The optical element of claim 1, wherein the mirror facet is at a center of the region.

16. The optical element of claim 1, wherein the region is concentrically disposed with respect to the mirror facet.

17. An illumination system having an optical path configured to illuminate an exit pupil in an exit pupil plane of the illumination system, the illumination system comprising:

an optical element comprising:
  a first region that transmits or reflects light; and
  a second region that is at least partially electrically conductive to produce an electrical current when exposed to EUV radiation,
wherein:
  the second region is separated from the first region;
  the second region is electrically insulated from the first region;
  the second region at least partially surrounds the first region; and
  the optical element is positioned along an optical path of the illumination system upstream of the exit pupil of the illumination system.

18. The illumination system of claim 17, further comprising a carrier element, wherein the first region is supported by the carrier element, the second region is supported by the carrier element, and the second region is electrically insulated from the carrier element.

19. The illumination system according to claim 17, wherein:
  the optical element is arranged in or near the exit pupil plane of the illumination system and/or in a plane that is conjugate to the exit pupil plane of the illumination system;
  the optical element further comprises:
    a carrier element;
    a plurality of first regions that reflect or transmit light; and
    a plurality of regions that are at least partially electrically conductive to produce an electrical current when exposed to EUV radiation;
  each first region is supported by the carrier element;
  each second region is supported by the carrier element;
  each second region is electrically insulated from the carrier element;
  each second region at least partially surrounds a corresponding first region;
  each second region is separated from its corresponding first region; and
  each second region is electrically insulated from its corresponding first region.

20. The illumination system according to claim 17, wherein the second region comprises first and second electrically conductive sectors.

21. The illumination system according to claim 17, wherein the second region comprises at least four electrically conductive sectors which form a quadrant detector.

22. The illumination system according to claim 17, further comprising a further optical element, the further optical element comprising:
  a plurality of field facets in the optical path so that the plurality of field facts divide light into a plurality of ray bundles that are directed to the optical element.

23. The illumination system according to claim 22, wherein at least one field facet includes a position-setting device configured to position the field facet relative to an incident light bundle.

24. The illumination system according to claim 23, further comprising a control/regulation unit electrically connected to the second region.

25. The illumination system according to claim 24, wherein the control/regulation unit is configured so that signals are registered in the second region and transmitted to the control/regulation unit, and so that the control/regulation unit is connected to a position-setting device configured to set a position of at least one field facet.

26. The illumination system according to claim 25, wherein the control/regulation unit is configured so that via the signals registered in the second region the position-setting device is controlled so that light impinging on the optical element impinges substantially on the mirror facet to compensate an angular drift of a light source.

27. The illumination system according to claim 17, further comprising a collector in the optical path upstream of the optical element.

28. The illumination system according to claim 17, comprising:

a first partial optical system comprising a light source; and
a second partial optical system comprising the optical element.

29. The illumination system according to claim 17, further comprising a position-setting device configured to set a position of a light source, an optical component, and/or the optical element.

30. The illumination system according to claim 17, further comprising a processing unit connected to the region.

31. The illumination system according to claim 30, wherein the processing unit is configured so that signals originating from the second region are transmitted to the processing unit, and so that the processing unit is connected to a position-setting unit configured so set a position of a light source, an optical component, and/or the optical element.

32. The illumination system according to claim 31, wherein the processing unit is configured so that the position-setting unit is controlled so that light impinges on the first region.

33. A projection objective configured to an object in an object plane along an optical path to an image in an image plane, the projection objective comprising:
   an optical element, comprising:
      a first region that reflects or transmits light; and
      a second region that is at least partially electrically conductive to produce an electrical current when exposed to EUV radiation,
   wherein:
      the second region is separated from the mirror facet;
      the region is electrically insulated from the first region;
      the second region at least partially surrounds the first region; and
      the optical element is positioned in the optical path of the projection objective.

34. The projection objective according to claim 33, wherein the second region completely surrounds the first region.

35. The projection objective according to claim 33, wherein the second region comprises first and second electrically conductive sectors, and the first electrically conductive sector is electrically insulated from the second electrically conductive sector.

36. The projection objective according to claim 33, wherein the second region comprises at least four conductive sectors which form a quadrant detector.

37. The projection objective according to claim 33, further comprising a position-setting device configured to set a position of the optical element, and/or an optical component of the projection objective.

38. The projection objective according to claim 37, further comprising a processing unit electrically connected to the second region.

39. The projection objective according to claim 38, wherein the processing unit is configured so that signals are registered in the second region and are transmitted to the processing unit and so that the processing unit is connected to a position-setting unit configured to set a position of the optical element, and/or an optical component.

40. The projection objective according to claim 39, wherein the processing unit is configured so that signals are registered in the second region and are transmitted to the processing unit and so that the processing unit is connected to at least one position-setting unit configured to set a position of the element and/or an optical component.

* * * * *

UNITED STATES PATENT AND TRADEMARK OFFICE
CERTIFICATE OF CORRECTION

PATENT NO. : 8,553,200 B2  
APPLICATION NO. : 12/751849  
DATED : October 8, 2013  
INVENTOR(S) : Bastiaan Theodoor Wolschrijn et al.

Page 1 of 1

It is certified that error appears in the above-identified patent and that said Letters Patent is hereby corrected as shown below:

On the Title Page, Column 1, Item (75), delete "Aboude" insert --Abcoude--;

In the Drawings

Sheet 5 of 7, FIG. 2f, delete "59002" insert --5900.2--;

In the Specifications

Column 3, line 29, delete "disclose" insert --disclosure--;

Column 6, Line 61, delete "regions" insert --regions.--;

Column 11, Line 24, delete "o" insert --of--;

Column 11, Line 48, delete "vi a" inset --via--;

Column 14, Line 54, delete "mit" insert --unit--;

Column 15, Line 67, delete "I1 to I4" insert --$I_1$ to $I_4$,--;

In the Claims

Column 19, Line 14, Claim 31, delete "so" insert --to--.

Signed and Sealed this  
Eighteenth Day of March, 2014

Michelle K. Lee  
*Deputy Director of the United States Patent and Trademark Office*